US010497596B2

(12) United States Patent
Dovids et al.

(10) Patent No.: US 10,497,596 B2
(45) Date of Patent: Dec. 3, 2019

(54) OVERHEAD MANUFACTURING, PROCESSING AND STORAGE SYSTEM

(71) Applicant: MURATA MACHINERY, LTD., Kyoto-shi, Kyoto (JP)

(72) Inventors: Gerhard Dovids, Grabs (CH); Yves Fenner, Berg (CH); John Fiddes, Kreuzlingen (CH); Christian Wohanka, Tägerwilen (CH); Bernd Rahrbach, Constance (DE)

(73) Assignee: MURATA MACHINERY, LTD., Kyoto (JP)

( * ) Notice: Subject to any disclaimer, the term of this patent is extended or adjusted under 35 U.S.C. 154(b) by 163 days.

(21) Appl. No.: 15/791,610

(22) Filed: Oct. 24, 2017

(65) Prior Publication Data

US 2018/0144964 A1 May 24, 2018

Related U.S. Application Data

(60) Provisional application No. 62/241,247, filed on Oct. 24, 2016.

(51) Int. Cl.
*H01L 21/677* (2006.01)
*B65G 47/61* (2006.01)

(52) U.S. Cl.
CPC ........ *H01L 21/67733* (2013.01); *B65G 47/61* (2013.01); *H01L 21/67706* (2013.01); *H01L 21/67769* (2013.01); *H01L 21/67781* (2013.01)

(58) Field of Classification Search
CPC .... B65G 1/045; B65G 1/0457; B65G 1/0464; B65G 1/10; B65G 1/127; B65G 47/61; B65G 2201/0297; H01L 21/67706; H01L 21/67733; H01L 21/67736; H01L 21/67346; H01L 21/67745; H01L 21/67763; H01L 21/67769; H01L 21/67781; Y10S 414/14
USPC ............ 294/213; 414/217.1, 222.07, 222.13, 414/223.01, 331.02, 940
See application file for complete search history.

(56) References Cited

U.S. PATENT DOCUMENTS

| 6,460,364 B1 * | 10/2002 | Tufo | F24F 11/30 62/285 |
| 2003/0235486 A1 * | 12/2003 | Doherty | H01L 21/67733 414/217.1 |
| 2006/0182553 A1 * | 8/2006 | Yamamoto | B65G 47/5104 414/278 |
| 2017/0000673 A1 * | 1/2017 | Harmeyer | A61G 7/1017 |

* cited by examiner

*Primary Examiner* — Saul Rodriguez
*Assistant Examiner* — Brendan P Tighe
(74) *Attorney, Agent, or Firm* — Keating & Bennett, LLP

(57) ABSTRACT

This disclosure relates generally to substrate and manufacturing system, processes and methods. In one example embodiment, to methods, apparatus, and systems which provides improved substrate processing and manufacturing wherein at least a portion of the system, apparatus or method may be in an overhead system, such as attached to a ceiling or overhead mounts, such that floor space and other efficiencies may be founded.

16 Claims, 18 Drawing Sheets

Installing at least a portion of a system in a ceiling of a fabrication facility
200

FIG. 2A

Configuring a portion of a system for mounting in a ceiling of a fabrication facility
220

FIG. 2B

Reducing a footprint of a system by mounting at least a portion of the system in a ceiling of a fabrication facility
240

FIG. 2C

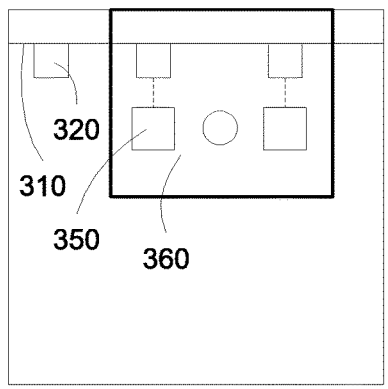
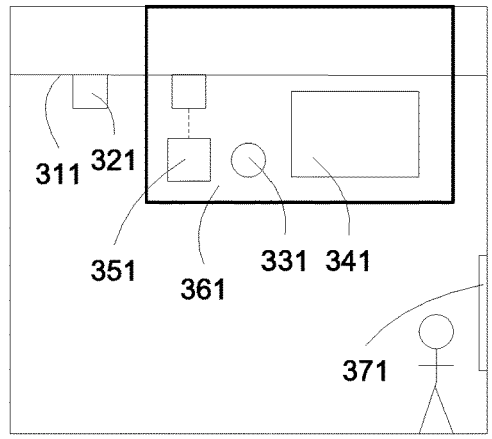
FIG. 3A  FIG. 3B
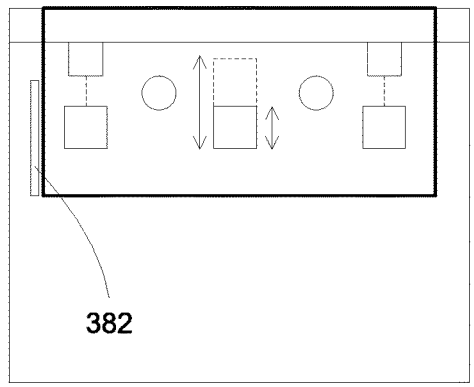
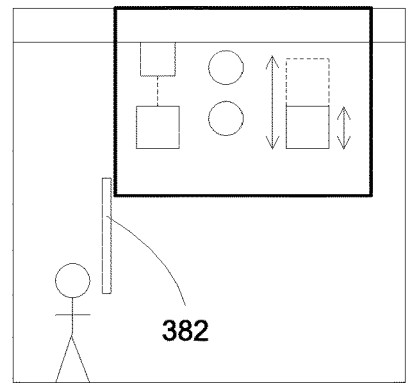
FIG. 3C (a)  FIG. 3C (b)
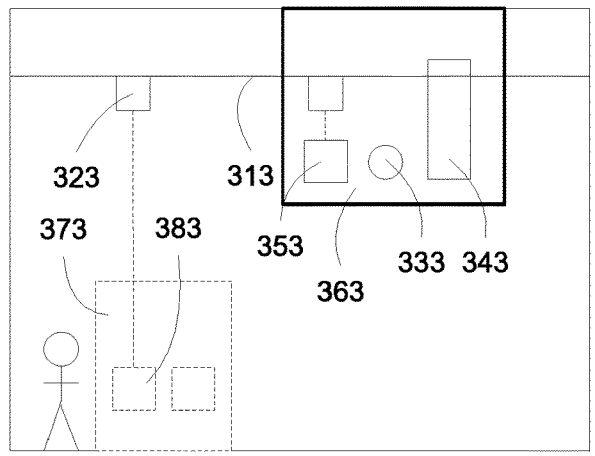
FIG. 3D

Forming a system, wherein the system is configured to be mounted on a ceiling of a fabrication facility
400

*FIG. 4A*

Receiving a container from a OHT track, wherein the OHT track is located on a ceiling of a fabrication facility
420

Transferring substrates from the container to a chamber using a moving mechanism, wherein the moving mechanism is mounted on the ceiling
430

*FIG. 4B*

Receiving a container from a OHT loading station, wherein the OHT loading station is located in a first system
450

Transferring the container to a second system, wherein the second system is mounted on the ceiling, wherein the second system is separated from the first system
460

Storing or processing the container in the second system
470

*FIG. 4C*

Forming a system, wherein the system is configured to be mounted on a ceiling of a fabrication facility with an operator accessed station located on a floor
600

FIG. 6A

Pulling down a controller from a ceiling system for accessing the ceiling system, wherein the ceiling system is configured to have at least a portion mounted on the ceiling
620

FIG. 6B

Inputting information on a wall controller unit for accessing the ceiling system, wherein the ceiling system is configured to have at least a portion mounted on the ceiling
640

FIG. 6C

Loading a container to a loading station on a floor
660

Transferring the container to a ceiling system or to an OHT track to be moved to the ceiling system, wherein the ceiling system is configured to have at least a portion mounted on the ceiling of a semiconductor fabrication facility
670

FIG. 6D

Forming a system, wherein a portion of the system is configured to be mounted on a ceiling of a fabrication facility with another portion located on a floor
800

FIG. 8A

Receiving a first container in a loading station
820

Processing the substrates in the first container in a process station on the floor and placing the processed substrates in a second container
830

Transferring the second container to a station on a ceiling
840

FIG. 8B

Receiving a first container in a loading station
860

Processing the substrates in the first container in a first station on a ceiling and placing the processed substrates in a second container
870

Transferring the second container to a second station on a floor
880

FIG. 8C

Forming a distributed system, wherein the distributed system is configured to be located at different locations on a ceiling and/or on a floor of a fabrication facility
1000

FIG. 10A

Receiving a container in a loading station on a floor
1020

Selecting a ceiling station, wherein the ceiling station is mounted on a ceiling
1030

Transferring the container to the selected ceiling station
1040

FIG. 10B

Selecting a loading station on a floor
1060

Selecting a ceiling station, wherein the ceiling station is mounted on a ceiling
1070

Transferring a container between the loading station and the ceiling station
1080

FIG. 10C

Forming a stocker, wherein the stocker is configured to be mounted on a ceiling of a fabrication facility
1200

FIG. 12A

Forming a stocker, wherein the stocker comprises a wall mounted controller, wherein the stocker is configured to have at least a portion mounted on the ceiling
1220

FIG. 12B

Forming a stocker, wherein the stocker is configured to use a loading station of another system, wherein the stocker is configured to have at least a portion mounted on the ceiling
1240

FIG. 12C

Loading a container to a loading station on a floor
1260

Transferring the container to a ceiling stocker, wherein the container is configured to be transferred to an input loading station or a loading station directly linked to a storage chamber of the stocker
1270

FIG. 12D

```
┌─────────────────────────────────────────────┐
│ Forming a distributed OHT track stocker      │
│ system for storing containers                │
│ 1400                                         │
└─────────────────────────────────────────────┘
```

FIG. 14A

```
┌─────────────────────────────────────────────┐
│ Forming a stocker, wherein the stocker       │
│ comprises a distributed OHT track system     │
│ within a purged enclosure mounted on a       │
│ ceiling                                      │
│ 1420                                         │
└─────────────────────────────────────────────┘
```

FIG. 14B

```
┌─────────────────────────────────────────────┐
│ Sending a container, from a stocker, to a    │
│ distributed OHT track system                 │
│ 1440                                         │
└─────────────────────────────────────────────┘
                      │
                      ▼
┌─────────────────────────────────────────────┐
│ Transferring the container to a processing   │
│ system                                       │
│ 1450                                         │
└─────────────────────────────────────────────┘
```

FIG. 14C

```
┌─────────────────────────────────────────────┐
│ Transferring containers between a processing │
│ system and a distributed OHT track stocker   │
│ system                                       │
│ 1480                                         │
└─────────────────────────────────────────────┘
```

FIG. 14D

Operating a ceiling stocker from a controller on a floor
1600

FIG. 16A

Sending a container to a ceiling stocker from a loading station on a floor
1620

FIG. 16B

Sending a container, from a loading station on a floor to an OHT track
1640

↓

Transferring the container to a ceiling stocker
1650

FIG. 16C

Selecting a ceiling stocker, wherein the ceiling stocker is mounted on a ceiling
1670

↓

Transferring a container between a loading station on a floor and the selected ceiling stocker
1680

FIG. 16D

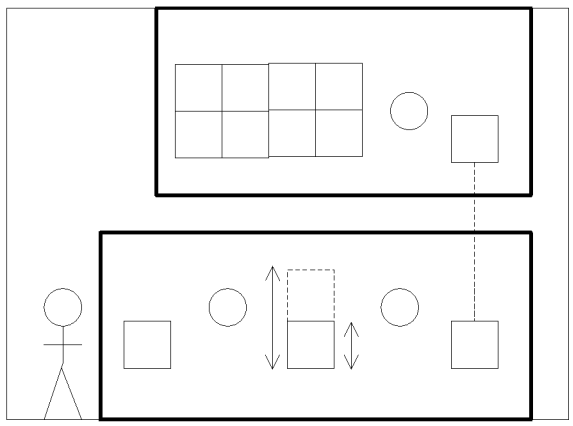
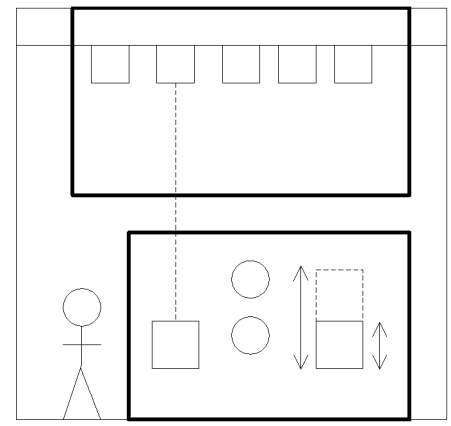
FIG. 17A     FIG. 17B
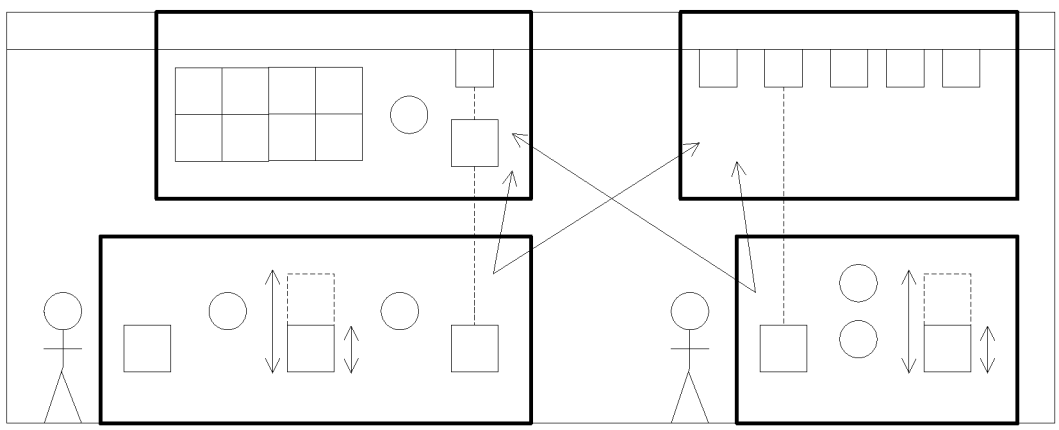
FIG. 17C

OVERHEAD MANUFACTURING, PROCESSING AND STORAGE SYSTEM

CROSS REFERENCE TO RELATED APPLICATIONS

This application claims priority from U.S. Provisional Patent Application 62/412,247, filed on Oct. 24, 2016 and entitled "Overhead Manufacturing, Processing and Storage System" and U.S. Provisional Patent Application 62/355,856, filed on Jun. 28, 2016 and entitled "Substrate Storage and Processing" which applications are incorporated herein by reference in their entirety for all purposes.

BACKGROUND OF THE INVENTION

1. Field of the Invention

This disclosure relates generally to substrate and manufacturing system, processes and methods. In one example embodiment, to methods, apparatus, and systems which provides an improved substrate and manufacturing system, process and method wherein at least a portion of the system process or method may be in an overhead system, such as attached to a ceiling or overhead mounts.

2. Description of the Related Art

Within many fields such as specifically within substrate manufacturing and related industries, the efficient and proper handling, storage and processing of materials such as substrates may be exceedingly important. Since the introduction of the 300 mm wafer semiconductor material, Front Opening Unified Pods, or "FOUPs," have become the standard storage and transport method of substrates and similar materials. FOUPs have been used to isolate and hold silicon wafers for use in semiconductor production. Semiconductors, fundamental in the design of digital circuitry, microprocessors, and transistors, require these wafers to remain in as close to immaculate condition as storage units allow.

Accordingly, FOUPs allow wafers to be transferred between other machines used in the processing and measurement of wafers. A recent improvement to this standard has been the Tec-Cell containers of which provide much higher density and volume of wafer or substrate storage as well as other improved abilities over prior FOUPs. However, with FOUPs being a standard within the industry and used in many machines still, until full implementation of Tec-Cells may be completed as well as a desire to use each in different circumstances, interchanges and sorting of wafers and substrates between Tec-Cells and FOUPs must be completed and in an efficient way.

A major part of substrate manufacturing and any manufacturing and process, may be space limitation. Within factories large processors, robots, manufacturing systems are used within a small confine of space such as in a factory, warehouse or building. Prior systems provide major systems, components, storage, processors, etc. as floor mounted or appreciably staged on the ground floor. With all the processes, systems and apparatuses on the floor, much space may be lost as this causes wasted space within the building. As well as taking up the ground floor space may cause logistical problems as people, carts, machines etc. of which are appreciably only able to travel or move on the floor will be hindered. Thus, it becomes clear that having machines, and systems of which could appreciably be relegated from the ground floor where they hinder processes, people and machines of which are necessary to be on the floor to another location.

Thus, a system that provides an ability to have a ceiling or overhead mounted systems, including transport systems, processing and manufacturing systems, storage, buffering, stocker systems, sorting systems, among many other systems and processes may be needed within the art to improve the efficiency of substrate and wafer manufacturing among other fields.

SUMMARY OF THE INVENTION

Disclosed are methods, apparatus, and systems that provide an improved substrate and manufacturing system, process and method wherein at least a portion of the system process or method may be in an overhead system, such as attached to a ceiling.

Preferred embodiment of the present invention may provide a system, apparatus or method which provides at the least an ability for processing, sorting, storage, buffering manufacturing, and other applicable systems within a manufacturing such as manufacturing substrates to be stored on the ceiling of a room. In an example embodiment, the present invention may provide at least an OHT (overhead transport system), of which may be of any plurality of tracks, robots and extension ability. These may include the ability to move in any direction and to any location along the ceiling. The transport system may then provide an OHT such as to be able to interact, carry or transport containers such as FOUPs or Tec-Cells, interchangeably with the correct manipulators between floor-mounted systems and ceiling mounted system.

The floor mounted systems may be any type as in prior systems, but appreciably may also include loading or transfer stockers, as well as user operated control interfaces and controllers. It may be noted that any mentioned may be permanently, or portably mounted to the floor, or any also hand or be connected to a ceiling mount by any method, as well as directly to an overhead ceiling mounted system. These may also be retracted up and down.

Additionally, there may be the ceiling mounted systems, of which may be of any type as provided in prior systems, but instead of being floor mounted may be appreciably mounted to the ceiling. The ceiling systems may interface with any number of the ceiling systems as well as floor systems, and a robot, or OHT, of which includes ceiling mounted OHT may move wafers, Tec-Cells and FOUPs between. The ceiling mounted systems may especially include, stockers, such as high density stockers and storage, transfer stations for moving wafers between Tec-Cells and FOUPs, as well as processing stations etc. It may be noted that the combination, permutation, plurality and direction of any processes may be in any order or direction.

It may be then seen that this invention may provide a given factory for processing or storing substrates and wafers, using container such as FOUPs or Tec-Cells appreciably a highly efficient space, such that the floor may be appreciably empty and allow for increased logistical options as well as space for walking or moving, because wherein the systems and apparatuses are appreciably attached or present as ceiling mounted and wherein the space underneath may be appreciably free.

The methods and systems disclosed herein may be implemented in any means for achieving various aspects. Other features will be apparent from the accompanying drawings and from the detailed description that follows.

BRIEF DESCRIPTION OF THE DRAWINGS

Example embodiments are illustrated by way of example and are not limited to the figures of the accompanying drawings, in which, like references indicate similar elements.

FIGS. 2A, 2B and 2C describe a flow chart of an embodiment of the present invention ceiling system.

FIGS. 3A, 3B, 3C, and 3D describes in a side component view, an embodiment of the present invention ceiling system.

FIGS. 4A, 4B and 4C describe a flow chart of an embodiment of the present invention ceiling system.

FIGS. 6A, 6B, 6C and 6D describe a flow chart of an embodiment of the present invention ceiling system.

FIGS. 8A, 8B and 8C describe a flow chart of an embodiment of the present invention ceiling system.

FIGS. 10A, 10B and 10C describe a flow chart of an embodiment of the present invention ceiling system.

FIGS. 12A, 12B, 12C and 12D describe a flow chart of an embodiment of the present invention ceiling system.

FIGS. 14A, 14B, 14C and 14D describe a flow chart of an embodiment of the present invention ceiling system.

FIGS. 16A, 16B, 16C and 16D describe a flow chart of an embodiment of the present invention ceiling system.

FIGS. 17A, 17B and 17C describe in a side component view, an embodiment of the present invention ceiling system.

Figure 1A:
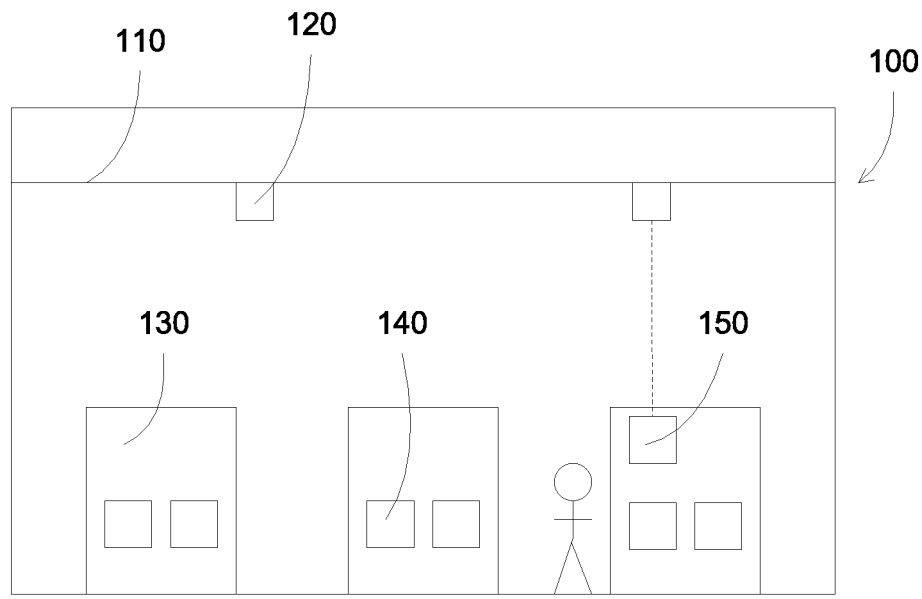
FIG. 1A describes in a side component view, a Prior Art Floor System.

Other features of the present embodiments will be apparent from the accompanying drawings and from the detailed description that follows.

DETAILED DESCRIPTION OF THE PREFERRED EMBODIMENTS

A few inventive aspects of the disclosed embodiments are explained in detail below with reference to the various figures. Exemplary embodiments are described to illustrate the disclosed subject matter, not to limit its scope, which is defined by the claims. Those of ordinary skill in the art will recognize a number of equivalent variations of the various features provided in the description that follows.

Embodiments of the present disclosure discloses a distributed substrate management system comprising a storage system for storing a plurality of substrates, a processing system for performing at least one action on the plurality of substrates, a loading system for loading and unloading the plurality of substrates to and from the storage and processing system, and a transportation system for transporting the substrates between the storage, processing, and loading systems. In an embodiment, at least one of the storage, loading, transportation, and processing system is ceiling mounted. In another embodiment, all of the storage, loading, transportation, and processing system are ceiling mounted.

The storage system comprises at least one of a high density and low-density containers, wherein the high density containers comprise Tec-cell containers and low-density containers comprise Front Opening Unified Pod (FOUP) containers. Further, the transportation system may be an overhead transportation track (OHT) or a transportation robot. The transportation robot may comprise a drop-down controller for manually controlling the robot. Further, the OHT may comprise storage racks or branched tracks for storage of semiconductor substrates or substrate containers.

Further, the processing system may comprise one or more of an ID reading station for reading IDs of substrates or containers. The processing system may further comprise a sorter station for sorting the substrates in a container or while storage. The processing system may further comprise an opener and a swapping station.

Embodiments of the present disclosure further discloses an automated control method for a substrate management station comprising. The method comprises receiving of a plurality of substrates from an overhead transportation track, unloading the plurality of substrates from the overhead transportation track into a processing station by a first loading station, processing the plurality of substrates in the processing station, unloading the plurality of substrates from the processing station into a second loading station, and loading the plurality of substrates from the second loading station into a storage station, wherein at least one of the storage, loading, and processing station is ceiling mounted. In an embodiment, the first and second loading station could be same or different.

The present invention in some embodiments, of which may be in addition to any other embodiments, may include an overhead system.

The present invention in some embodiments, of which may be in addition to any other embodiments may include a ceiling mounted system.

The present invention in some embodiments, of which may be in addition to any other embodiments may include a ceiling mounted system wherein the system may include subsystems.

The present invention in some embodiments, of which may be in addition to any other embodiments may include a ceiling mounted system wherein the system may include subsystems wherein the subsystems are for processing, storing or otherwise manipulating containers such as FOUPs or Tec-Cells wherein the container hold substrates or wafers.

The present invention in some embodiments, of which may be in addition to any other embodiments may include a ceiling mounted system wherein the system may include subsystems, of which all the subsystems are ceiling mounted.

The present invention in some embodiments, of which may be in addition to any other embodiments may include a ceiling mounted system wherein the system may include subsystems wherein some subsystems are ceiling mounted and some are floor mounted.

The present invention in some embodiments, of which may be in addition to any other embodiments may include a ceiling mounted system wherein the system may include subsystems wherein containers such as FOUPs or Tec-Cells may move between the subsystems.

The present invention in some embodiments, of which may be in addition to any other embodiments may include a ceiling mounted system wherein the system may include subsystems wherein containers such as FOUPs or Tec-Cells may move between the subsystems such as via an OHT.

The present invention in some embodiments, of which may be in addition to any other embodiments may include a ceiling mounted system wherein the system may include subsystems wherein containers such as FOUPs or Tec-Cells may move between the subsystems in any combination or direction or plurality.

The present invention in some embodiments, of which may be in addition to any other embodiments may include a ceiling mounted system wherein the system may include subsystems wherein a drop-down controller may exist for manipulation by a user for any subsystem of for the entire system.

The present invention in some embodiments, of which may be in addition to any other embodiments may include a ceiling mounted system wherein the system may include subsystems wherein the subsystem may provide any system, such as a stocker, heater, processor, or may sort or buffer the system.

The present invention in some embodiments, of which may be in addition to any other embodiments may include a ceiling mounted system wherein the system may include subsystems that are incorporated into an existing floor mounted system or ceiling system.

The present invention in some embodiments, of which may be in addition to any other embodiments may include a ceiling mounted system wherein the system may include subsystems wherein each subsystem or some subsystems include purge gas abilities.

The present invention in some embodiments, of which may be in addition to any other embodiments may include a ceiling mounted system wherein the system may due to being ceiling mounted reduce or eliminate the ground footprint, allowing other logistics such as users, containers, carts etc. to use the ground floor, increasing efficiency and space requirements for systems.

The present invention in some embodiments, of which may be in addition to any other embodiments, may include distributed OHT tracks for storage of Tec-Cell carriers/containers as well as FOUPs and other containers. It may be noted that the tracks may be conventional tracks, conveyors or any other method. The present invention in some embodiments, of which may be in addition to any other embodiments may include an operator station on floor for access to the ceiling mounted systems. This may include a facility with drop ceiling.

The present invention in some embodiments, of which may be in addition to any other embodiments may include ceiling system related applications wherein the system may be installed on the ceiling, thus may achieve zero-foot print on the ground level. This minimization of a footprint may be accomplished by installing a portion of the system on the ceiling.

The present invention in some embodiments, of which may be in addition to any other embodiments, may include the ceiling may have a drop ceiling, similar to a raise floor, which may allow a laminar flow through the system, to the space between the ceiling and the drop ceiling.

The present invention in some embodiments, of which may be in addition to any other embodiments may include a complete ceiling system, such as a stocker in ceiling, including a OHT load port, robot and storage all installed on the ceiling. Additional stations may be included, such as opener stations, sorter stations, or transfer stations (e.g., changing from one container to another container, different types of containers or same types of containers, or just different containers).

The present invention in some embodiments, of which may be in addition to any other embodiments, may include simplified complete ceiling systems may be used, e.g., only storage areas without a load port or a robot, such as making a special OHT storage area, which may include tracks for individual FOUPs. The OHT storage area may be used to store high density containers, such as Tec-Cell containers (new or existing containers).

The present invention in some embodiments, of which may be in addition to any other embodiments may include partial ceiling systems, such as a stocker with a portion (the storage areas) in ceiling, and a portion on the floor (the operator loading station). Other stations may be in the ceiling or on the floor, such as a sorter station, a transfer station, and an opener station (or a zoom station).

The present invention in some embodiments, of which may be in addition to any other embodiments may include a partial floor system, such as an operator access station on the floor. The partial floor system may include an EFEM, which may be placed on the floor, in order to the operator to access the system, such as to place a FOUP for the system to process. The system may be a stocker, or a processing system, which may be placed partially on the ceiling.

The present invention in some embodiments, of which may be in addition to any other embodiments, may include a partial floor system, such as an operator access station on the floor. The partial floor system may include a monitor, which may be placed on the floor, in order to the operator to access the system. The system may be a stocker, or a processing system, which may be placed partially on the ceiling. The load port may be an OHT load port, thus located in the ceiling.

The present invention in some embodiments, of which may be in addition to any other embodiments, may include wherein all parts of the system may be in ceiling. Alternatively, a part of a system may be mounted in the ceiling with other parts optionally on the floor. Specifically, a storage station may be in the ceiling. An operator interface station may be on the floor, with the rest of the system in the ceiling. The ceiling component may be grouped in one location, or may be spread out, e.g., distributed throughout.

The present invention in some embodiments, of which may be in addition to any other embodiments may include a Stocker system on ceiling. Additionally, at least the storage station of the stocker may be placed on the ceiling. Other stations, such as load port and robot, may be either on the ceiling, or on the floor or for instance the sorter stations on ceiling.

The present invention in some embodiments, of which may be in addition to any other embodiments at least a sorter station may be placed on the ceiling. Other stations, such as load port and robot, may be either on the ceiling, or on the floor.

The present invention in some embodiments, of which may be in addition to any other embodiments includes an ID reader stations on the ceiling where at least the ID reader station may be placed on the ceiling. Other stations, such as load port and robot, may be either on the ceiling, or on the floor.

The present invention in some embodiments, of which may be in addition to any other embodiments may include a transfer and swap stations on the ceiling wherein at least the transfer or swap station may be placed on the ceiling. Other stations, such as load port and robot, may be either on the ceiling, or on the floor. The transfer station may be used to transfer wafers from one type of container to a different type of container, such as from a FOUP to a higher density Tec-Cell container. The swap station may be used to transfer wafers from one container to a different but same type of container, such as from a FOUP to another FOUP.

The present invention in some embodiments, of which may be in addition to any other embodiments may include distributed OHT tracks for storage of Tec-Cell containers where at least OHT tracks may be used to store Tec-Cell containers. The tracks may be configured so that the containers may be randomly accessible, e.g., like a car parking lot. Alternatively, first in last out configuration may be used, with a temporary storage for swapping containers.

The present invention in some embodiments, of which may be in addition to any other embodiments, may include an operator station on the floor for access to the system on the ceiling wherein the operator access station on the floor, and processing or storage stations on ceiling. Wafers, FOUPs, or Tec-Cell containers may be loaded to the operator access station to be transferred to the ceiling station. Alternatively, FOUPs, or Tec-Cell containers may come from an OHT to be transferred to the ceiling station.

The present invention in some embodiments, of which may be in addition to any other embodiments may include at least one monitor on the floor to allow an operator to run systems on ceiling. For example, the load port may be an OHT load port, thus may accept a FOUP from OHT track. A robot on the ceiling may be coupled to the OHT load port to access the wafers in the FOUP, and then bringing the wafers to a processing or storage system, which may be also on ceiling.

Additionally, a load port on the floor to accept FOUPs or Tec-Cell containers, which may then transfer to an OHT load port.

The present invention in some embodiments, of which may be in addition to any other embodiments, may include an EFEM on the floor to accepts FOUPs or Tec-Cell containers, with a robot to transfer FOUPs or Tec-Cell containers or wafers to a ceiling processing or storage station.

The present invention in some embodiments, of which may be in addition to any other embodiments, may include semiconductor manufacturing and processing facility with drop ceiling wherein the facility may have drop ceiling, which may be configured for mounting ceiling components of a system. The drop ceiling may be linked to the ceiling components to allow laminar flow through the system, ending at the space between the ceiling and the drop ceiling. This configuration may be similar to a raise floor of a facility, which may allow laminar flow through the system and ending at the raise floor.

Although the present embodiments have been described with reference to specific example embodiments, it will be evident that various modifications and changes may be made to these embodiments without departing from the broader spirit and scope of the various embodiments. It should be understood by one of ordinary skill in the art that the terms describing processes, products, elements, or methods are industry terms and may refer to similar alternatives. In addition, the components shown in the figures, their connections, couples, and relationships, and their functions, are meant to be exemplary only, and are not meant to limit the embodiments described herein.

FIG. 1A (Prior Art) describes in a side component view, a Prior Art Floor System. It may be easily seen in FIG. 1A how the Prior Art system provides for limited floor space and using overhead space in a given area. In the FIG. 1A Prior Art it may be seen in a given workspace 100, there may be workpieces, such as stockers, processors, heaters, etc. 130, of which may include containers or compartments such as FOUPs or Tec-Cells 140. Objects 150, such as the aforementioned may be moved with an overhead transport system such as a track 110 with arm or robot 120, of which may be overhead and reach down to the components of the system.

Figure 1B:
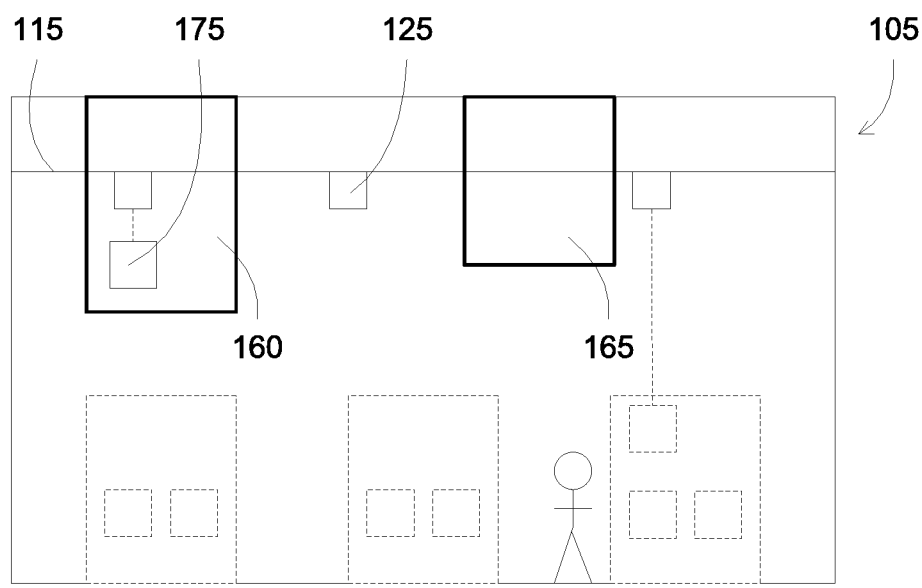
FIG. 1B describes in a side component view, an embodiment of the present invention ceiling system.

FIG. 1B describes in a side component view, an embodiment of the present invention ceiling system. It may be easily seen that at least a portion, or in an embodiment all of a processing facility and components may be fixed to the ceiling. The system includes a fabrication facility 105. The facility 105 may be a whole space or a part of a whole space. Facility 105 further includes a conveyor or an overhead transport 115. The overhead transport 115 may be movement tracks as used for wagon movement. To this conveyor or overhead transport 115 is attached a moving robot or arm 125 that traverses the conveyor or the overhead transport 115. The facility 105 further includes overhead compartments like stockers, processors, heaters etc., 160 and 165. The overhead compartments 160 and 165 are adapted to receive containers 175. Containers 175 may be, however not limiting the scope of the invention, FOUPs or Tec-cells. These containers 175, can be entered or exited from the overhead compartments 160 and 165 by using the moving robot or arm 125, traversing over the overhead transport or conveyor 115.

FIGS. 2A, 2B and 2C describe a flow chart of an embodiment of the present invention ceiling system. FIG. 2A describes Process 200 including at least installing at least a portion of a system in a ceiling of a fabrication facility. This process reduces footprint of the system in the semiconductor manufacturing and processing facility. Process 220 includes configuring a portion of a system for mounting in a ceiling of a fabrication facility and Process 240 includes reducing a footprint of a system by mounting at least a portion of the system in a ceiling of a fabrication facility. In a preferred embodiment, all portions of the substrate management system could be installed on the ceiling of the semiconductor manufacturing and processing facility.

FIGS. 3A, 3B, 3C, and 3D describes in a side component view, an embodiment of the present invention where a complete system is on ceiling of the semiconductor manufacturing and processing facility. As shown in FIG. 3A, a conveyer 310 with mover 320 may be used for transporting semiconductor substrates to a storage or processing station 360. The storage or processing station 360 may comprise a robot for loading and unloading the mover 320 into the storage or processing station 360. The mover 320 may transport FOUPs or Tec-Cells or other containers 350 for storing inside the station 360 with the help of the robot. It may be noted that there may be two OHT loading stations (one for input and one for output).

FIG. 3B illustrates a conveyor such as an OHT 311 with a mover 321 for transporting semiconductor substrate container to an unloading position 351 within a storage station 361. The storage station 361 comprises a robot 341 for loading/unloading container or substrates from the mover 321 to a stocker processor 341. The storage station 361 may also be a processing station and may comprise an ID reading station, a sorter station, a swapping station, etc. Further, an access controller 372 may be used by human operators for controlling functioning of the OHT 311 and the robot 341.

FIG. 3C (a) illustrates a swapping station which may be used to swap FOUP and Tec-cells. For example, there may be an input for low density FOUP and an output high density Tec-cell container. Similarly, FIG. 3C (b) illustrates a swapping station for an input of high density Tec-Cell containers and an output for low density FOUP. Both configurations are used to switch wafers between the container types for any use. There may be two OHT on two ends or one OHT on one end, depending on space and throughput requirements, in accordance with an embodiment of the present disclosure. Further, the swapping stations may use an optional drop down controller 382. The controller 382 may be used for loading containers from ground or for unloading containers to the ground. The controller may be pulled down by a user for accessing its functionalities and for accessing the swapping station.

FIG. 3D illustrates an integrated system describing both prior floor mounted systems and the inventive ceiling mounted systems. The system may use a loader system. For example, in an embodiment, the ceiling system 363 uses a floor mounted OHT loading station 373 for automatically or manually loading containers. A container such as a Tec-Cell or FOUP 383 may be entered or stored in the OHT loading station 373 and an OHT 323 may pick up the container and travel along track 313 at ceiling level. The OHT 323 may then enter a ceiling mounted process/storage system 363, wherein the FOUP/container 353 or its wafers may be manipulated by a robot 333. The wafers may then be stored in the storage or processing station 343. Further, in an embodiment, an operator may load FOUP on loading system 383, then bring the FOUP to OHT track 313, and then bring the FOUP to the OHT loading station 363.

FIGS. 4A, 4B and 4C describe a flow chart of an embodiment of the present invention ceiling system. FIG. 4A describes Process 400 which includes forming a system, wherein the system may be configured to be mounted on a ceiling of a fabrication facility. FIG. 4B describes Process 400 which includes receiving a container from an OHT track, wherein the OHT track may be located on a ceiling of a fabrication facility wherein at least forming a system and the process 430 includes transferring substrates from the container to a chamber using a moving mechanism, wherein the moving mechanism may be mounted on the ceiling. FIG. 4C describes process 450 which includes receiving a container from a OHT loading station wherein the OHT loading station may be located in a first system, process 460 which includes transferring the container to a second system wherein the second system may be mounted on the ceiling and the second system may be separated from the first system, and process 470 which includes storing or processing the container in the second system.

These and any process may include at least forming a system on ceiling, storing or processing in a system on ceiling and the storage/process station 440, ID reading station, sorter station, swapping system and integrated systems of ceiling mounted and floor mounted systems. Also noted may be that any of the process and system may work in reverse such as process in a ceiling system, then transfer container to a loading station of another system or take a container out of a stocker, then transfer the container to a loading station of another system.

It is noted that the second system may include an ID reading station, a sorter station, a swapping system, and integrated systems of ceiling mounted and floor mounted systems. It will be appreciated by a person with ordinary skills in the art that the system may work in reverse, such as process in a ceiling system, then transferring container to a loading station of another system or take container out of a stocker, then transfer container to a loading station of another system.

Figure 5A:
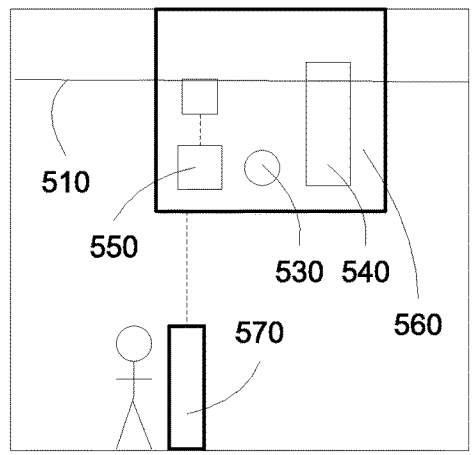
FIGS. 5A, 5B, 5C, 5D and 5E describes in a side component view, an embodiment of the present invention ceiling system.

FIGS. 5A, 5B, 5C, 5D and 5E describe, in a side component view, an embodiment of the present invention wherein an operator present on floor of the semiconductor manufacturing and processing facility operates its ceiling mounted storage and processing system. FIG. 5A illustrates an operation station such as a computer or controller 570 on the floor of the semiconductor manufacturing and processing facility. The controller 570 may be used by an operator to load recipe, process, etc. and which may connect wirelessly to the system. Further, an operation station may be mounted on the ceiling and may be pulled down by an operator, or may be free standing or floor mounted.

Figure 5B:
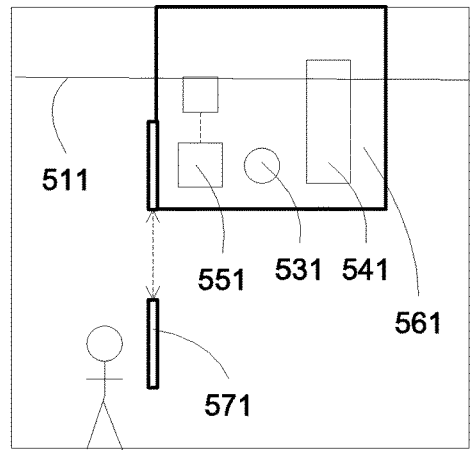

Additionally, the station may be handheld or portable. Moreover, there may be an OHT 510, which enters into the processing/storage compartment 560 for storing a FOUP or Tec-Cell 550. A robot 530 may be used for manipulating and storing containers into the storage 540. FIG. 5B describes the same invention as FIG. 5A but with a moveable computer or controller 571, which may be configured to move vertically or horizontally in reference from the ceiling station.

Figure 5C:
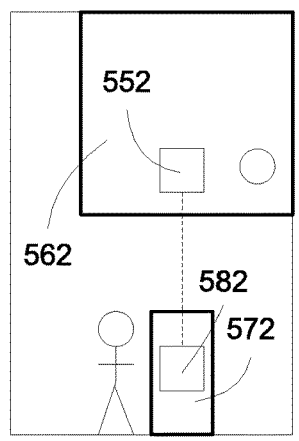
Figure 5D:
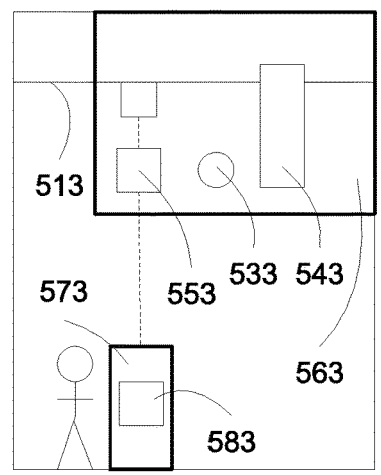
Figure 5E:
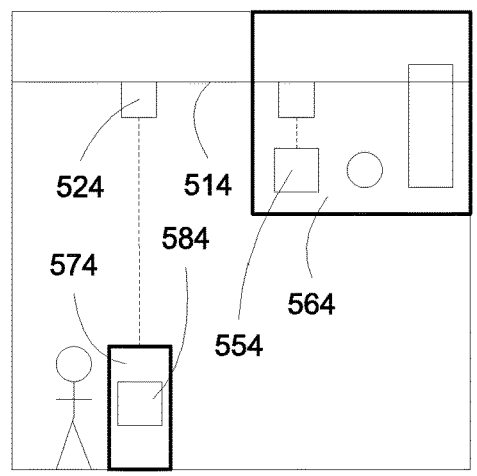

FIG. 5C described a floor mounted FOUP loading station 572. As shown, a FOUP 582 may be moved from the floor mounted station 572 to a ceiling mounted station 562. Also, as shown, the FOUP 552 may be ceiling mounted. Similarly, FIG. 5D describes a floor mounted FOUP loading station 573. As shown, a FOUP 583 may be moved from the floor mounted station 574 to a ceiling mounted station 563. Further, the FOUP 553 may be ceiling mounted and attached to an OHT 513.

In addition, a robot 544 may be used for manipulating (storing or processing) the FOUP 553 to enter the storage/processing/sorter or Tec-Cell transfer station 543 within overhead system 563. Similarly, FIG. 5E describes a FOUP 584 within a floor mounted station 574, wherein it may be connected to a OHT 524 via a ceiling mounted track 514. The track may load the FOUP into position 554 in ceiling mounted system 564, wherein an EFEM and a controller may be included. In an embodiment, the system may be configured to be mounted on a ceiling of a fabrication facility with an operator accessed station located on a floor. In another embodiment, the system may comprise a pull-down controller for accessing the ceiling system. In another embodiment, the system supports inputting of information on a wall controller unit for accessing the ceiling system.

FIGS. 6A, 6B, 6C and 6D describe a flow chart of an embodiment of the present invention ceiling system. This may include an embodiment with a ceiling system which includes an operator station on floor or system on the ceiling, and an operator station on the floor.

FIG. 6A describes Process 600 which includes forming a system, wherein the system may be configured to be mounted on a ceiling of a fabrication facility with an operator accessed station located on the floor.

FIG. 6B describes Process 620 which includes pulling down a controller from a ceiling system for accessing the ceiling system, wherein the ceiling system may be configured to have at least a portion mounted on the ceiling.

FIG. 6C describes Process 640 which includes inputting information on a wall controller unit for accessing the ceiling system, wherein the ceiling system may be configured to have at least a portion mounted on the ceiling.

FIG. 6D describes Process 660 which includes loading a container to a loading station on a floor, and process 670 which includes transferring the container to a ceiling system or to an OHT track to be moved to the ceiling system, wherein the ceiling system may be configured to have at least a portion mounted on the ceiling of a semiconductor fabrication facility.

It is noted that these aforementioned and later mentioned flow charts may be used for complete ceiling system (with loading station of another separate system) and for ceiling system with loading station on floor, use loading station of another system, the another system may have software to allow transfer to ceiling system, the another system may have software to allow another program to access the loading station, the ceiling system and the system having the loading station are two independent systems, linked by OHT track and software and the ceiling system may have a loading station on the floor and the rest on the ceiling, among others.

Figure 7A:
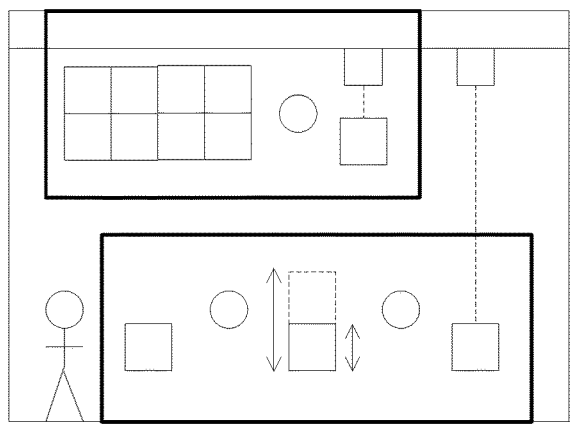
FIGS. 7A, 7B and 7C describes in a side component view, an embodiment of the present invention ceiling system.
Figure 7B:
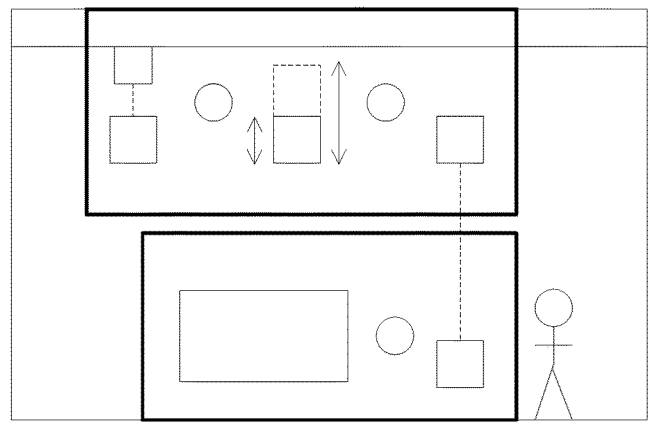
Figure 7C:
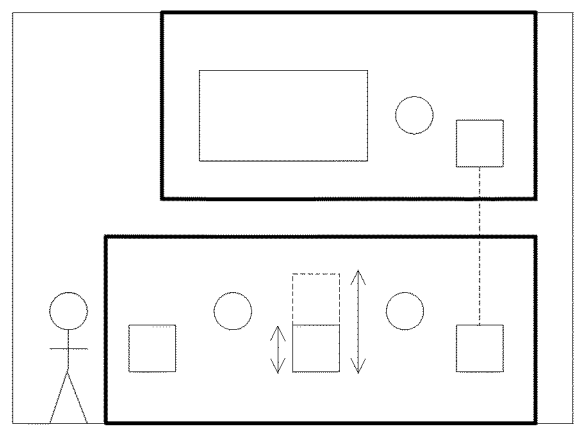

FIGS. 7A, 7B and 7C describe in a side component view, an embodiment of the present invention in which a ceiling system works with other floor components of a semiconductor manufacturing and processing facility. More specifically, FIG. 7A illustrates a ceiling system 702 with other components of floor system 704 such as an EFEM or a loading station on the floor. For example, the floor system 704 may be used to input a FOUP, change to a high density Tec-Cell, and then transfer the Tec-Cell to a storage chamber mounted on the ceiling system 702.

FIG. 7B describes a process system 706 installed on the floor. The process system 706 may be used for processes such as, deposition, etching, ID reading, sorting, etc. In a preferred embodiment, the process system 706 may be a conventional process system which is used to receive inputs from inventive ceiling mounted system 708. For example, the ceiling system 708 may have a stocker storing high density Tec-Cells. The ceiling system 708 may thereby be used to transfer the Tec-Cells to the process system 706 to change to a low density FOUP.

Similarly, FIG. 7C illustrates at least an EFEM or a loading station installed on floor in a floor system 710 of the semiconductor manufacturing and processing facility. The floor system 710 may be used to process high density Tec-Cells and change them to low density FOUPs. Thereafter, the FOUPs may be transferred to a process chamber mounted on a ceiling system 712 of the semiconductor manufacturing and processing facility. The process system 712 may be configured to perform processes such as deposition, etching, ID reading, and sorting.

FIGS. 8A, 8B and 8C describe a flow chart of an embodiment of the present invention ceiling system. FIG. 8A describes at least a ceiling system with other components of the floor. Process 800 describes at least forming a system, wherein a portion of the system may be configured to be mounted on a ceiling of a fabrication facility with another portion located on a floor.

FIG. 8B describes at least Process 820 which includes receiving a first container in a loading station, Process 830 which includes processing the substrates in the first container in a process station on the floor and placing the processed substrates in a second container, and Process 840 which includes transferring the second container to a station on a ceiling.

It may be noted that process may be first on floor, and move to ceiling to continue and the process may be ID reading, sorting, densify or enlarge density, deposition, etch, storing, etc.

FIG. 8C describes at least Process 860 which includes receiving a first container in a loading station, Process 870 which includes processing the substrates in the first container in a first station on a ceiling and placing the processed substrates in a second container, and Process 880 which includes transferring the second container to a second station on a floor.

It may be noted that the process may take place first on the ceiling, and move to the floor to continue, wherein the process may be ID reading, sorting, densify or enlarge density, deposition, etch, storing, etc.

Figure 9A:
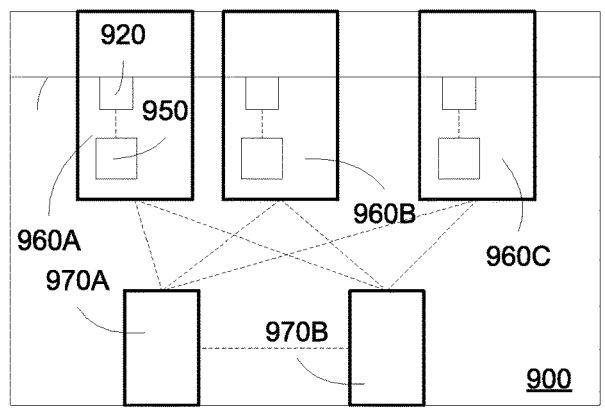
FIGS. 9A, 9B and 9C describes in a side component view, an embodiment of the present invention ceiling system.
Figure 9B:
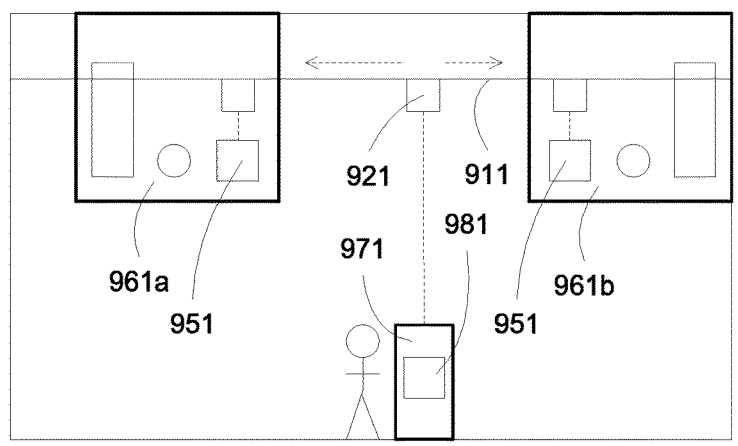
Figure 9C:
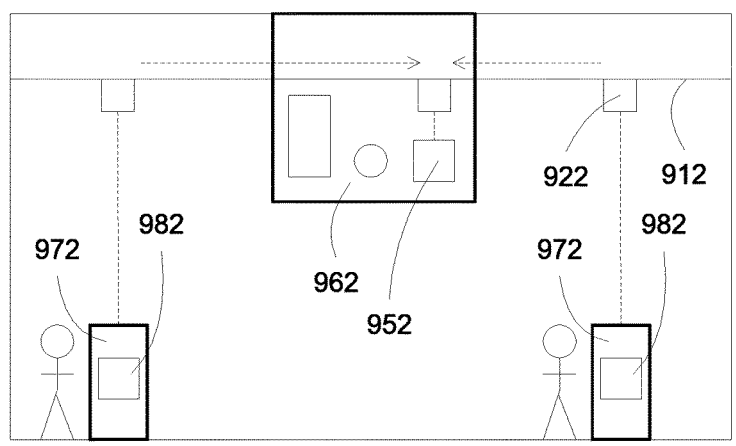

FIGS. 9A, 9B and 9C describe in a side component view, an embodiment of the present invention wherein a plurality of ceiling systems and floor systems are distributed throughout a semiconductor manufacturing and processing facility. More specifically, the semiconductor manufacturing and processing facility has multiple ceiling components distributed throughout the facility and multiple loading stations distributed throughout facility at different locations, etc. In an embodiment of the present invention, the loading stations and the ceiling components may be moveable components.

Specifically, FIG. 9A illustrates a Ceiling/Floor distributed system 900 comprising many floor loading stations for serving one ceiling systems. Such setup may be referred as a floor distributed system. In other words, there may be one ceiling system serviced by multiple floor systems. Similarly, a ceiling distributed system may comprise one floor loading station for serving multiple ceiling systems. Further, the system 900 may comprise at least an OHT 920 that may include a FOUP or a container such as a Tec-Cell 950. The OHT may be configured to move between ceiling mounted systems 960A, 960B and 960C as well as floor mounted systems 970A and 970B in any order. Particularly, the OHT may be used to connect the distributed floor and ceiling mounted systems in the semiconductor manufacturing and processing facility.

FIG. 9B illustrates a specific embodiment of a ceiling distributed system of the semiconductor manufacturing and processing facility. The system, as illustrated, comprises a single floor loading station for multiple ceiling systems. The floor loading station may be configured to load a FOUP to any ceiling system. In an embodiment, containers such as FOUP or Tec-Cell 951 may be moved between a plurality of subsystems 961a and 961b though an OHT 921 mounted on a track 911. Additionally, the FOUP 951 may be lowered into a position 981 for transferring it to the floor mounted systems of any plurality.

FIG. 9C illustrates a floor distributed system comprising one ceiling system serviced by multiple floor systems. The floor systems may comprise any loading stations on floor and may be used for loading containers to a single ceiling system. A container such as a Tec-Cell or FOUP 982 may be able to travel from floor-mounted systems such as system 971 via an OHT 922 using a track 912 to a ceiling mounted system 962 at a position 952. It may be noted this configuration may be accomplished in any order and may include from floor mounted to floor mounted movements, such as to pass through the ceiling system as well as from floor to ceiling or ceiling to floor movements.

FIGS. 10A, 10B and 10C describe a flow chart of an embodiment of the present invention ceiling system. FIG. 10A describes a distributed ceiling system with ceiling components throughout fab and loading stations throughout fab. This may include at least process 1000 forming a distributed system, wherein the distributed system may be configured to be located at different locations on a ceiling and/or on a floor of a fabrication facility.

FIG. 10B may include one loading station for multiple ceiling stations of which includes at least process 1020 which includes receiving a container in a loading station on a floor, process 1030 which includes selecting a ceiling station wherein the ceiling station may be mounted on a ceiling, and process 1040 which includes transferring the container to the selected ceiling station. It may be noted that the reverse operations for any process may be performed in another embodiment such as sending a container from a ceiling system to a loading station.

FIG. 10C may include the action of transferring and also processing substrates and wafers, after transfer, or any other actions such as sorting, reading, heating etc. This may include at least Process 1060 which includes selecting a loading station on a floor, Process 1070 which includes selecting a ceiling station wherein the ceiling station may be mounted on a ceiling, and Process 1080 which includes transferring a container between the loading station and the ceiling station.

It is noted that the process may be based on a distributed ceiling system with ceiling components throughout facility and loading stations throughout facility. The distributed system may be configured to be located at different locations on a ceiling and/or on a floor of the fabrication facility. These systems may also interact with non-ceiling based systems as well.

Figure 11A:
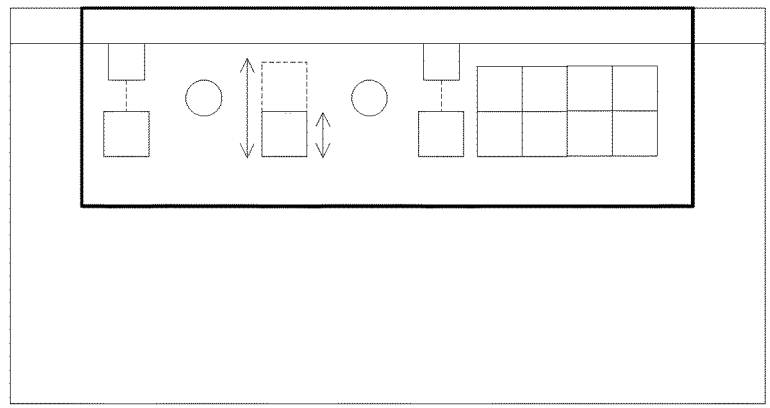
FIGS. 11A, 11B, 11C and 11D describes in a side component view, an embodiment of the present invention ceiling system.

FIGS. 11A, 11B, 11C and 11D describe in a side component view, an embodiment of the present invention wherein a ceiling system is used as a complete ceiling stocker. Specifically, FIG. 11A illustrates a ceiling mounted system 1102 comprising a stocker to store high density Tec-Cell or low density FOUPs. The ceiling stocker may comprise an OHT loader for FOUP, an opener, and a high density Tec-Cell container. The containers may be swapped by the ceiling mounted system 1102 between high and low density containers.

Figure 11B:
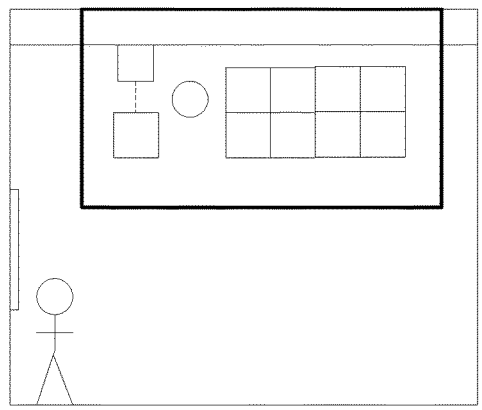

FIG. 11B illustrates another ceiling mounted system 1102 comprising a stocker storing high density Tec-Cell containers in its storage chamber. The system 1102 may use an OHT to transfer containers and may also use the OHT as storage. The system 1102 may use a controller on wall of the semiconductor manufacturing and processing facility for controlling the functioning of the system 1102. In an embodiment, the controller may be human operated and may be used for guiding an OHT to transfer containers and may also be used for controlling a robot in the system 1102 in loading, unloading, or processing of semiconductor substrates stored in the high density Tec-Cells.

Figure 11C:
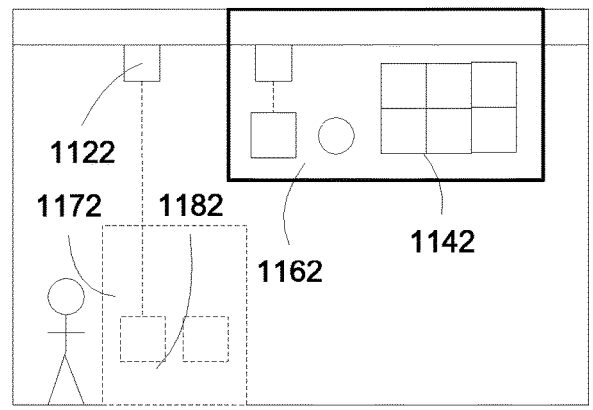

FIG. 11C illustrates an additional loading station 1172 on the floor of the semiconductor manufacturing and processing facility as illustrated in the system 1102 of FIG. 11B. The loading station 1172 may be an independent loading station designed to service the ceiling systems. Generally, an OHT is used as a loading station. However, the system is capable of embodying external loading systems also, as illustrated in FIG. 11C. The loading station may load containers 1182 from ground to ceiling mounted storage stockers 1142. An OHT track may be used for moving containers from the loading station to the ceiling system 1162 and into the stockers 1142.

Figure 11D:
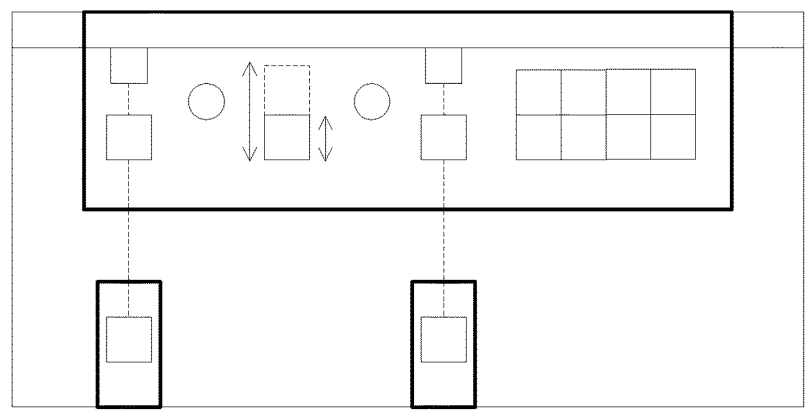

FIG. 11D illustrates an embodiment of distributed ceiling system 1102 which is distributed throughout the semiconductor manufacturing and processing facility. The semiconductor manufacturing and processing facility may be operated by software. The software may be used to automate functioning of the facility and to operate the processing stations and the swapping stations to convert low and high density containers such as FOUP and Tec-Cells. Further, as illustrated, the ceiling system may comprise multiple stockers, robots, and loading stations for transporting substrate containers. In a preferred embodiment, the stockers comprise a wall-mounted controller, wherein the stocker may be configured to have at least a portion mounted on the ceiling. In another preferred embodiment, the stocker may be configured to use a loading station of another system.

FIGS. 12A, 12B, 12C and 12D describe a flow chart of an embodiment of the present invention ceiling system. FIG. 12A describes at least Process 1200 which includes forming a stocker, wherein the stocker may be configured to be mounted on a ceiling of a fabrication facility.

FIG. 12B describes at least Process 1220 which includes forming a stocker, wherein the stocker comprises a wall mounted controller and wherein the stocker may be configured to have at least a portion mounted on the ceiling.

FIG. 12C describes at least Process 1240 which includes forming a stocker, wherein the stocker may be configured to use a loading station of another system and the stocker may be configured to have at least a portion mounted on the ceiling.

FIG. 12D describes at least Process 1260 which includes loading a container to a loading station on a floor, and Process 1270 which includes transferring the container to a ceiling stocker, wherein the container may be configured to be transferred to an input loading station or a loading station directly linked to a storage chamber of the stocker.

Figure 13A:
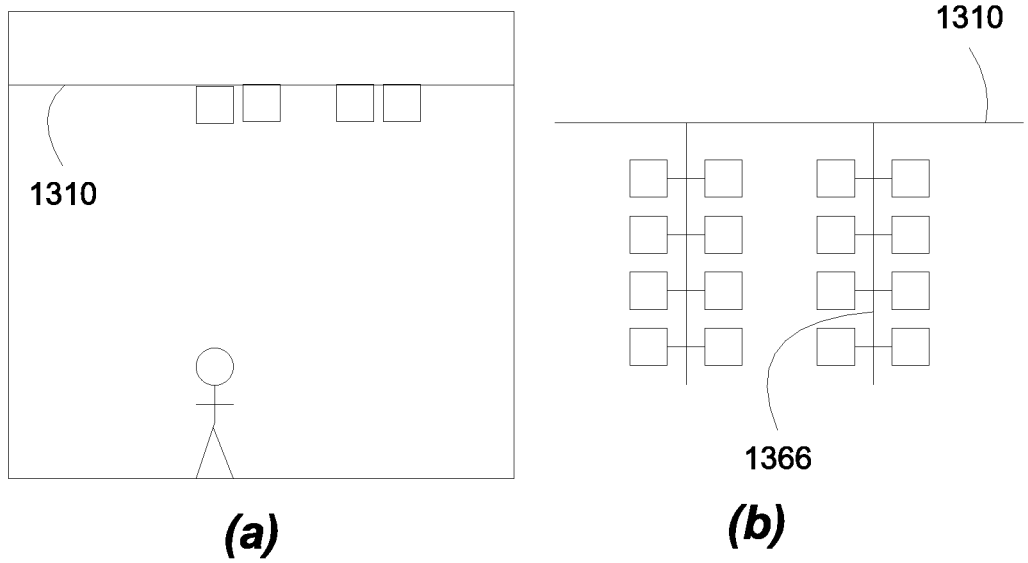
FIGS. 13A and 13B describe in a side component view, an embodiment of the present invention ceiling system.
Figure 13B:
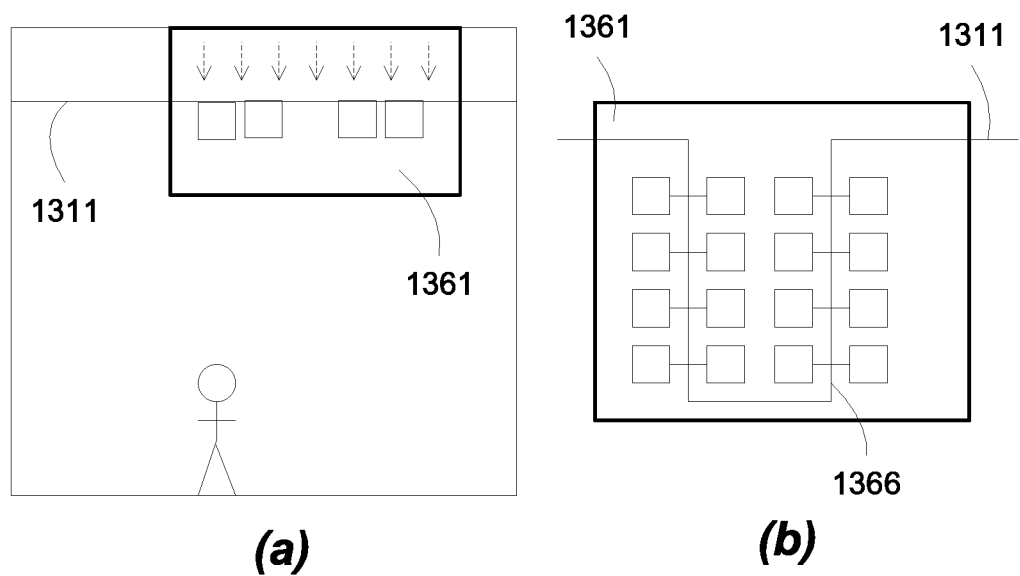

FIGS. 13A and 13B describe in a side component view, an embodiment of the present invention wherein a ceiling system is used as a distributed OHT track stocker. Specifically, FIGS. 13A (a) and 13A (b) illustrate an OHT as a storage system (such that the FOUP may be stored in open area). The OHT track may be designed in such a way that the FOUPs may be stored at the branch tracks 1366, and may get out to the main track 1311 while storage. In addition, the system may be capable of storing high density Tec-Cell containers. Further, FIGS. 13B (a) and 13B (b) also illustrate an OHT as a storage system 1361. However, in addition to the system illustrated in FIG. 13A, the system may use a cover with laminar flow surrounding the storage area wherein the OHT 1311 may follow a high density storage track 1366 within the storage 1361.

FIGS. 14A, 14B, 14C and 14D describe a flow chart of an embodiment of the present invention including a ceiling system for FOUPs or high density Tec-Cells that uses the OHT stocker as a temporary storage, and that uses the OHT stocker as stocker storage.

FIG. 14A describes at least process 1400 which includes forming a distributed OHT track stocker system for storing containers.

FIG. 14B describes at least process 1420 which includes forming a stocker, wherein the stocker comprises a distributed OHT track system within a purged enclosure mounted on a ceiling.

FIG. 14C describes at least process 1450 which includes sending a container, from a stocker, to a distributed OHT track system, and process 1450 which includes transferring the container to a processing system.

FIG. 14D describes at least process 1480 which includes transferring containers between a processing system and a distributed OHT track stocker system.

Figure 15A:
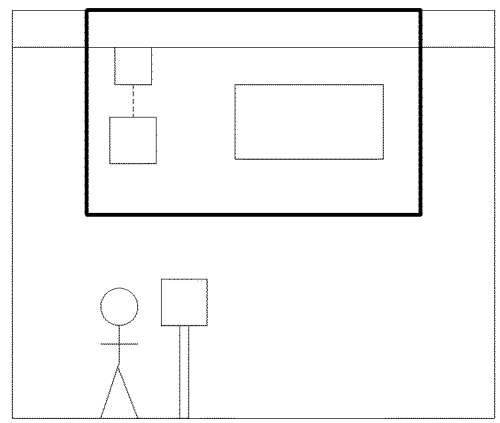
FIGS. 15A, 15B, 15C and 15D describes in a side component view, an embodiment of the present invention ceiling system.

FIGS. 15A, 15B, 15C and 15D describe, in a side component view, an embodiment of the present invention wherein the ceiling system of the semiconductor manufacturing and processing facility may include a stocker with an operator station on the floor. The stocker may include link to a configuration of ceiling system. Specifically, FIG. 15A illustrates an operator monitoring station 1502. The station can also be used as a controlling station 1502 controlled by a human operator. The station 1502, as illustrated, is installed on floor of the semiconductor manufacturing and processing facility.

Figure 15B:
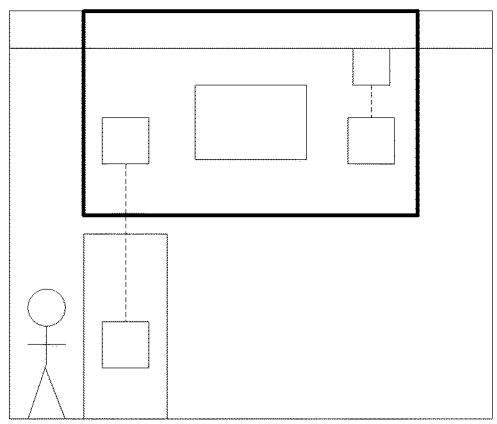
Figure 15C:
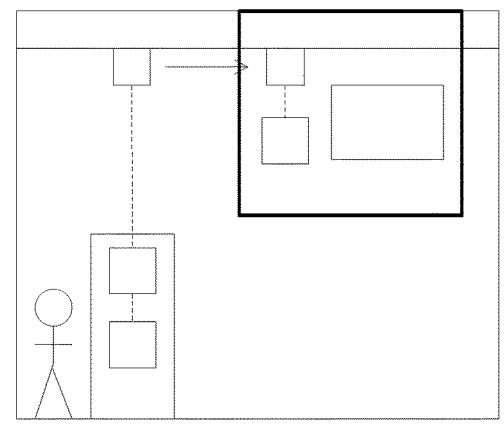
Figure 15D:
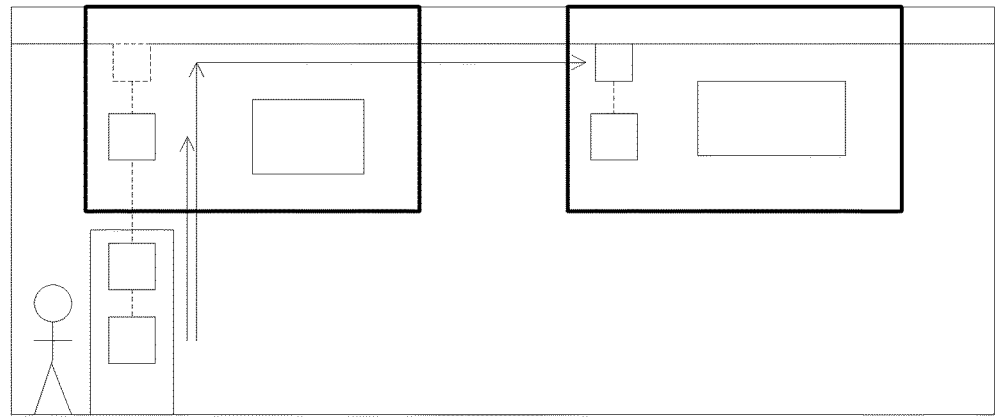

Further, FIG. 15B describes another operator loading station 1504 installed on the floor. The system as illustrated may be used to move a FOUP to the loading station mounted on a ceiling system of the semiconductor manufacturing and processing facility. The FOUP may be moved up to an OHT track by the loading station, and the OHT track may move the FOUP to the ceiling mounted stockers for storage or for further processing, as illustrated in FIG. 15C. Similarly, FIG. 15D illustrates an embodiment where a floor operator loading station 1504 is used for serving multiple ceiling systems mounted on ceiling of the semiconductor manufacturing and processing facility. The single floor mounted station may use the OHT track to transport FOUP from one ceiling station to another. In a preferred embodiment, multiple floor mounted operator loading stations may also be used.

FIGS. 16A, 16B, 16C and 16D describe a flow chart of a preferred embodiment of the present invention ceiling system.

FIG. 16A describes at least process 1600 which includes operating a ceiling stocker from a controller on a floor.

FIG. 16B describes at least process 1620 which includes sending a container to a ceiling stocker from a loading station on a floor.

FIG. 16C describes at least process 1640 which include sending a container, from a loading station on a floor to an OHT track and process 1650 transferring the container to a ceiling stocker.

FIG. 16D describes at least process 1670 which includes selecting a ceiling stocker, wherein the ceiling stocker may be mounted on a ceiling, and process 1680 which includes transferring a container between a loading station on a floor and the selected ceiling stocker.

FIG. 16A-D may in a preferred embodiment describe a flow chart of a process for operating a ceiling stocker from a controller installed on a floor of a semiconductor manufacturing and processing facility. In another preferred embodiment, a process for sending a container to a ceiling stocker from a loading station on a floor of semiconductor manufacturing and processing facility is disclosed. In another preferred embodiment, a process for sending a container from a loading station on a floor to an OHT track and a process for transferring the container to a ceiling stocker is disclosed. In one another preferred embodiment, a process of selecting a ceiling stocker, for transferring a container between a loading station on a floor and the selected ceiling stocker is disclosed.

It is noted that the controller may be used to load, unload, transport, and process the substrates stored in the ceiling stocker and a controller or multiple controllers may be used any point for any task or control operation FIGS. 17A, 17B and 17C describe, in a side component view, a preferred embodiment of the present invention wherein a stocker may have a portion installed on the floor and a portion installed on ceiling of the semiconductor manufacturing and processing facility. The floor systems 1704 and ceiling systems 1702 may be linked to transport wafers between them.

Specifically, a ceiling mounted system 1702 and a ground system 1704 is illustrated in FIGS. 17A and 17B that divides semiconductor manufacturing and processing work in a way that at least one of storage, loading, opener, or processing work is done on ceiling system 1702 and other on the ground system 1704.

In particular, FIG. 17A illustrates direct loading of substrate container to ceiling portion and FIG. 17B illustrates loading of the substrate container first to an OHT track 1706 and then to the ceiling portion. It may be noted that any plurality and combination of transfers may be done within the system for any reason such as space saving or to enlist previously owned equipment or processors, storages etc. Further, FIG. 17C illustrates a partial distributed system wherein multiple components may be on the floor system 1704 with one component on the ceiling system 1702. Similarly, multiple components may be on the ceiling with one component on the floor and multiple components may be on the ceiling with multiple components on floor.

FIG. 18 describes a flow chart of a process for densifying substrates in a container available on a floor of the semiconductor manufacturing and processing facility. The process may also be used for transferring a container from a ceiling stocker to a floor system for processing. The processing comprises enlarging spaces between substrates in the container.

Figure 18A:
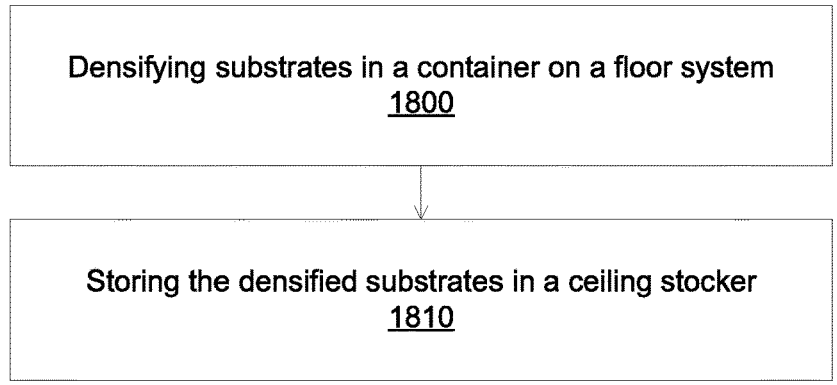
FIGS. 18A, 18B and 18C describe a flow chart of an embodiment of the present invention ceiling system.
Figure 18B:
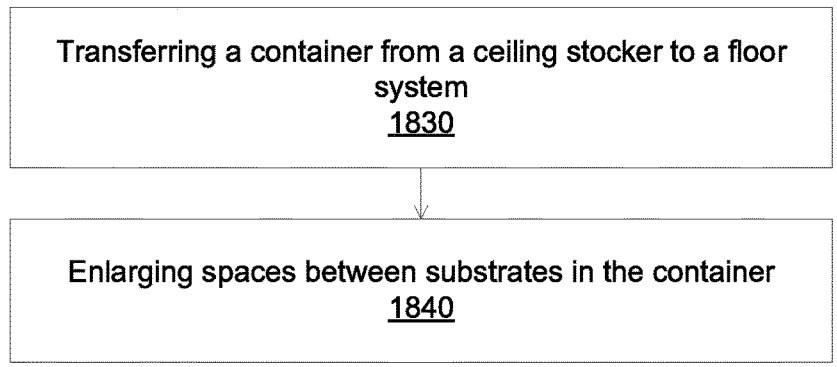
Figure 18C:
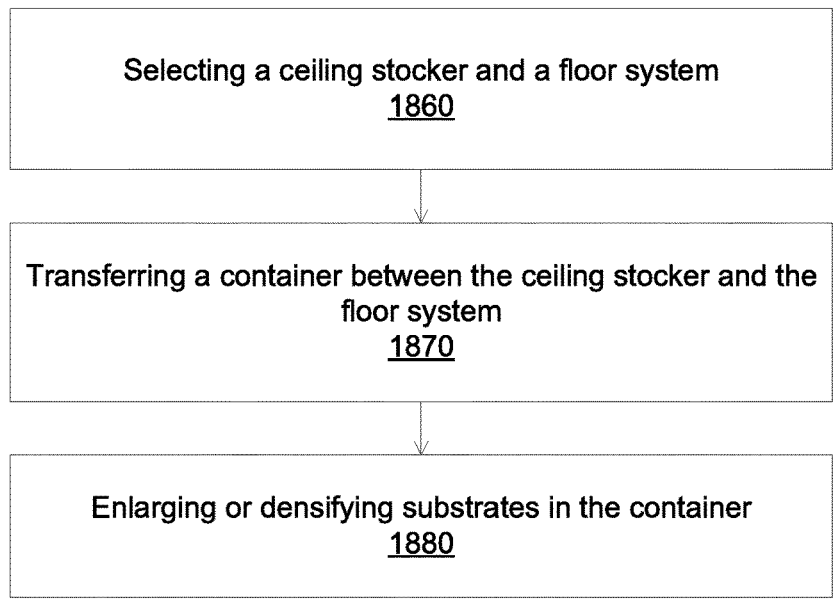

FIGS. 18A, 18B and 18C describe a flow chart of an embodiment of the present invention ceiling system.

FIG. 18A describes at least process 1800 with includes densifying substrates in a container on a floor system, and process 1810 which includes storing the densified substrates in a ceiling stocker.

FIG. 18B describes at least process 1830 which includes transferring a container from a ceiling stocker to a floor system, and process 1840 with includes enlarging spaces between substrates in the container.

FIG. 18C describes at least process 1860 which includes selecting a ceiling stocker and a floor system, process 1870 which includes transferring a container between the ceiling stocker and the floor system, and process 1880 which includes enlarging or densifying substrates in the container.

A number of preferred embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

It may be appreciated that the various systems, methods, and apparatus disclosed herein may be embodied in a machine-readable medium and/or a machine accessible medium compatible with a data processing system (e.g., a computer system), and/or may be performed in any order.

The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. A substrate processing system comprising:
    a storage system for storing a plurality of substrates;
    a processing system for performing at least one action on the plurality of substrates;
    a loading system for loading and unloading the plurality of substrates to and from the storage system and the processing system; and
    a transportation system for transporting the substrates between the storage system, the processing system, and the loading system; wherein
    each of the storage system, the processing system, the loading system, and the transportation system is ceiling mounted.

2. The substrate processing system of claim 1, wherein each of the storage system, the processing system, the loading system, and the transportation system being ceiling mounted reduces a foot print of the substrate processing system.

3. The substrate processing system of claim 1, wherein the storage system includes a high density container and a low density container, wherein the high density container holds substrates at a higher density than the low density container.

4. The substrate processing system of claim 3, wherein the low density container includes a Front Opening Unified Pod (FOUP) container.

5. The substrate processing system of claim 1, wherein the storage system includes an opener station, an ID reading station, a transfer station, or a high density storage.

6. The substrate processing system of claim 1, further comprising an operator station that is located on a floor and that provides access to the storage system, the processing system, the loading system, and the transportation system.

7. The substrate processing system of claim 1, further comprising a controller unit.

8. The substrate processing system of claim 7, wherein the controller unit is a user operable drop down controller.

9. The substrate processing system of claim 8, wherein the user operable drop down controller is configured to move vertically and horizontally in reference to a ceiling.

10. The substrate processing system of claim 8, wherein the user operable drop down controller is configured to be manually pulled down by a user.

11. The substrate processing system of claim 1, wherein the transportation system includes an overhead transportation track (OHT).

12. The substrate processing system of claim 1, wherein the storage system, the processing system, the loading system, and the transportation system are integrated with conventional non-ceiling systems.

13. The substrate processing system of claim 1, wherein space underneath the storage system, the processing system, the loading system, and the transportation system is free for logistical operations.

14. A substrate processing system comprising:
    a low density container; and
    a high density container that holds substrates at a higher density than the low density container;
    a storage system for storing a plurality of substrates;
    a processing system for performing at least one action on the plurality of substrates;
    a loading system for loading and unloading the plurality of substrates to and from the storage system and the processing system; and
    a transportation system for transporting the substrates between the storage system, the processing system, and the loading system; wherein
    each of the storage system, the processing system, the loading system, and the transportation system is ceiling mounted.

15. The substrate processing system of claim 14, wherein the storage system includes an opener station, an ID reading station, a transfer station, or a high density storage.

16. The substrate processing system of claim 14, further comprising a controller unit including a user operable drop down controller.

* * * * *